(12) United States Patent
Künzer

(10) Patent No.: US 6,583,678 B2
(45) Date of Patent: Jun. 24, 2003

(54) ELECTRICAL CIRCUIT AND METHOD FOR PULSE MODULATION OF A CARRIER SIGNAL

(75) Inventor: Frank Künzer, Kraichtal-Menzingen (DE)

(73) Assignee: Valeo Schalter und Sensoren GmbH, Bietigheim-Bissingen (DE)

( * ) Notice: Subject to any disclaimer, the term of this patent is extended or adjusted under 35 U.S.C. 154(b) by 0 days.

(21) Appl. No.: 09/985,502

(22) Filed: Nov. 5, 2001

(65) Prior Publication Data

US 2002/0063609 A1 May 30, 2002

(30) Foreign Application Priority Data

Nov. 30, 2000 (DE) .......................................... 100 59 585

(51) Int. Cl.$^7$ ................................................ H03K 7/00
(52) U.S. Cl. ...................................... 332/106; 332/111
(58) Field of Search ................................ 332/106, 111, 332/112, 115, 107, 109

(56) References Cited

U.S. PATENT DOCUMENTS 3,924,203 A * 12/1975 Schemmel .................. 332/106
5,680,078 A * 10/1997 Ariie .......................... 332/178
6,292,067 B1 * 9/2001 Sasabata et al. ............ 332/115

* cited by examiner

Primary Examiner—Robert Pascal
Assistant Examiner—Joseph Chang
(74) Attorney, Agent, or Firm—Paul Vincent (57) ABSTRACT

The invention concerns an electric circuit and a method for pulse modulation of a carrier signal (10). The circuit comprises a pulse generator for generating a current pulse and at least one diode switch (12) which can be controlled by the current pulse. To modulate the carrier signal (10) with a particularly short pulse with a clear, square envelope (21), using as simple and inexpensive a circuit as possible, the invention proposes that the circuit comprises at least one chargeable capacitive element (C) whose discharge current controls the at least one diode switch (12). The capacitive element (C) is formed e.g. as a capacitor. The capacitive element (C) is charged with a charging voltage ($U_L$) via a charging resistance (R). Switching of a transistor (18) initiates the discharging process and a current pulse is generated for controlling the diode switch (12).

17 Claims, 5 Drawing Sheets

ELECTRICAL CIRCUIT AND METHOD FOR PULSE MODULATION OF A CARRIER SIGNAL

This application claims Paris Convention priority of DE 100 59 585.5 filed Nov. 30, 2000 the complete disclosure of which is hereby incorporated by reference.

BACKGROUND OF THE INVENTION

The present invention concerns an electrical circuit for pulse modulation of a carrier signal. The circuit comprises a pulse generator for generating a current pulse and at least one diode switch which can be controlled by the current pulse. The invention also concerns a method for pulse modulation of a carrier signal by means of at least one diode switch. A current pulse is thereby generated which is used to control the at least one diode switch.

Circuits of the above-mentioned type are used e.g. for pulse modulation of a radio-frequency carrier signal which are used e.g. for distance radar systems in motor vehicles. The diode switch is triggered by the current pulse generated by the pulse generator and switches a radio-frequency (RF) signal for a very short time period (0.1 to 10 ns).

The function of a diode switch is explained in more detail below with reference to a conventional electric circuit shown in FIG. 2. A typical diode switch 9 comprises a signal line 1 and a lambda/4 stub lead which branches off therefrom. An oscillator 3, which provides a radio-frequency carrier signal 4, is disposed at the input of the signal line 1. A control voltage source U is connected to the stub lead 2 and the control voltage U is applied to and removed from the stub lead 2 by closing and opening a switch 7. Repeated opening and closing of the switch 7 pulse-modulates the carrier signal 4 and the pulse-modulated radio-frequency carrier signal 6 is available at an output 5 of the signal line 1.

When a diode 8, disposed at the end of the stub lead 2, is conducting (switch 7 is closed), a signal can pass from the oscillator 3 to the output 5 of the diode switch 9. When the diode blocks (switch 7 is open) no signal can pass from the oscillator 3 to the output 5. The lambda/4 stub lead 2, which is connected to the diode 8, "inverts" the behavior of the diode 8. During open-circuit operation (diode 8 blocks) and in case of a short-circuit (diode 8 is conducting), the signal in the stub lead 2 is reflected. This produces destructive overlapping during open-circuit operation (incoming and reflected signal are phase-shifted relative to one another by half a period) after the lambda/4 stub lead 2. In case of a short-circuit, the signals overlap constructively after the lambda/4 stub lead 2 (incoming and reflected signal are not phase-shifted relative to one another).

Diode 8 is usually a PIN diode. A PIN diode permits switching times (shortest pulse which can be generated at the output 5) of longer than 10 ns. The very small PIN diode resistance in the switched state is advantageous. To achieve considerably faster switching times, a Schottky diode can be used instead of the PIN diode. This permits switching times in the sub-ns range.

The considerably higher dynamic resistance of the Schottky diode has, however, disturbing effects. The dynamic resistance of the diode determines the insertion attenuation of the diode switch (i.e. the losses). The parasitic or stray quantities, in particular the capacitance, determined the maximum achievable isolation of the diode switch 9. The minimum achievable performance loss of the diode switch 9, i.e. with conducting diode 8, is determined by the dynamic resistance of the diode 8. The capacitance also permits small current flow to ground in the blocking state of the diode 8. The isolation of the diode switch 9 can be doubled by using a second diode connected in parallel to the first diode 8. However, this also doubles the minimum achievable power loss for the switched diode switch 9.

Figure 2:
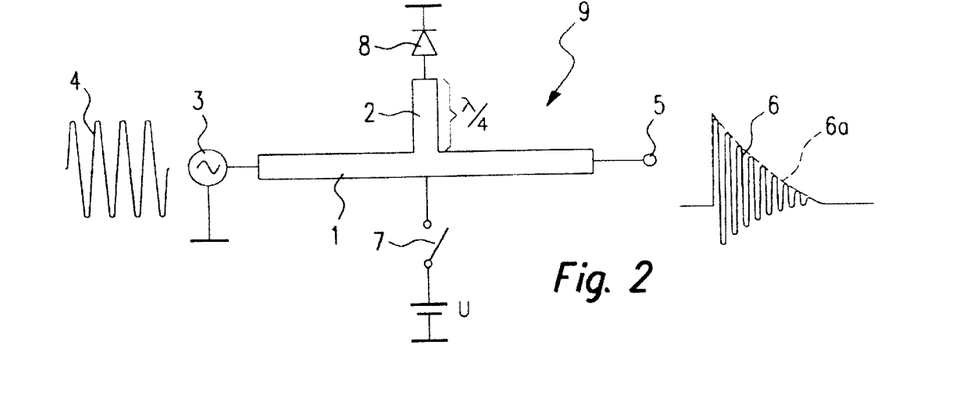
FIG. 2 shows a conventional circuit for pulse modulation of a carrier signal.

The circuit shown in FIG. 2 has the additional disadvantage that the envelope 6a of the pulse-modulated radio-frequency carrier signal 6 present at the output 5 of the diode switch 9 does not have a clean, square behavior. Rather, the dependence of the envelope is exponential ($e^{-t}$). When using the known circuit e.g. in a distance radar system, the position resolution obtained can be higher the shorter the emitted pulses. The shorter pulses, however, also contain reduced signal energy which renders the signal particularly susceptible to disturbances. For this reason, it is important, in particular with very short pulses, that the emitted signal, i.e. the pulse-modulated signal 6 present at the output 5 of the diode switch 9 has a clean, preferably square envelope 6a.

In view of these considerations, it is the object of the present invention to provide a circuit and a method for modulating a carrier signal with as short pulses as possible having a clean, square envelope.

SUMMARY OF THE INVENTION

To solve this object, the invention proposes, on the basis of the electrical circuit of the above-mentioned type, that the circuit has at least one chargeable capacitive element whose discharge current controls the at least one diode switch.

The capacitive element is formed e.g. as a capacitor. It can be one individual capacitor or a series connection, a parallel connection or a combination of series and parallel connections of several capacitors. The inventive electric circuit permits modulation of a carrier signal with very short pulses having a particularly clean, square envelope. Moreover, the inventive circuit can be realized at particularly low costs.

The at least one capacitive element is initially charged through a charging resistance. Thereafter, the at least one capacitive element can be discharged at any desired point in time. The discharge current thereby controls the at least one diode switch of the electric circuit. Rapid discharge of the capacitive element produces very short current pulses. A discharge current thereby flows only until the at least one capacitive element has been discharged. The charging resistance is thereby dimensioned such that after discharging, the or each capacitive element can nearly completely recharge prior to the next current pulse.

An advantageous further development of the present invention proposes that the circuit has several diode switches with stub leads connected in parallel. Each stub lead branch has one diode, to ensure that the discharge current flows in one direction only. The maximum achievable isolation of the diode switch can be considerably increased through parallel connection of several diodes.

In another advantageous further development of the present invention, the circuit comprises at least one semiconductor switch connected in series with the/each diode switch, wherein the charged capacitive element can be discharged by a control pulse via the/each semiconductor switch and the/each diode switch after controlling the at least one semiconductor switch. The at least one capacitive element is thus discharged by controlling a semiconductor switch with a control pulse. The control pulse merely serves for triggering the discharge process. It may even last longer than the current pulse. As soon as the capacitive element is discharged, the current pulse also terminates, irrespective of whether or not the control pulse is still present on the semiconductor switch.

The/each semiconductor switch is preferably formed from a transistor and, advantageously, from a field effect transistor (FET). An FET has nearly ohmic behavior in the switched state.

In a preferred embodiment of the present invention, the circuit comprises two semiconductors, wherein the control pulse can be applied to a control contact of one semiconductor switch and a variable direct voltage is applied to a control contact of the other semiconductor switch. Application of the control pulse to the one semiconductor switch initiates the discharging process of the capacitive element. The minimum resistance in the conducting state of the one semiconductor switch can be adjusted through the variable direct voltage which is applied to the other semiconductor switch. The larger the resistance of the semiconductor switch in the conducting state, the longer it takes until the at least one capacitive element has been completely discharged to prolong the generated current pulse and the pulses which are modulated on the carrier signal by the inventive circuit.

The variable direct voltage permits adjustment of the spatial resolution or signal energy of emitted pulses e.g. in distance radar systems. Longer pulses of higher energy can be emitted for scanning remote regions. For scanning closer regions, shorter pulses can be emitted. The short pulses have a higher spatial resolution to permit safe and reliable detection of even small obstacles.

The two semiconductor switches are preferably formed as a field effect transistor (FET) comprising two gates. Such FETs are also called Dual-Gate-FETs. The variable direct voltage permits variation of the maximum drain current of the Dual-Gate-FET and hence of the discharge time of the capacitive element and the pulse duration of the pulse-modulated carrier signal. The drain current must have a minimum magnitude which permits control of all diodes of the diode switch.

In another advantageous further development of the present invention, a semiconductor unit is disposed in a branch of the circuit through which the capacitive element is charged and is switched through during the charging process. The semiconductor unit is preferably a diode. The at least one capacitive element can be charged during the charging process in the usual manner via a semiconductor unit switched in this fashion. During the discharging process, the semiconductor unit blocks and causes the entire discharge current to flow through the diode switch and not through the charging resistance.

In another advantageous further development of the present invention, the circuit comprises means for interrupting the charging process of the at least one capacitive element for at least as long as the control pulse is applied to at least one semiconductor switch. The charging signal for the at least one capacitive element and the control signal for the semiconductor switch are therefore never simultaneously HIGH. This further development prevents residual current from flowing through the charging resistance after the discharging process. If the charging signal is at LOW, discharge of the at least one capacitive element via the charging resistance can be prevented by the semiconductor unit disposed in the branch of the circuit via which the at least one capacitive element is charged.

In a preferred embodiment of the present invention, the interrupting means comprise delaying members for delaying the rising side of the control pulse and the rising side of the charging signal. The charging signal is usually at HIGH. The control signal is usually at LOW except during the control pulses. During the control pulses, the control signal is at HIGH. In a first step, the inverted control signal is used as the charging signal. The delaying members take into account inclined signal sides to ensure that, during the control pulse, the charging signal is at LOW. A first delaying member delays the rising side of the control signal, while the charging signal is changed from HIGH to LOW using the rising side of the undelayed control signal. A second delaying member delays the rising side of the charging signal which then changes from LOW to HIGH with a temporal shift relative to the falling side of the control signal. The charging signal of this embodiment is safely at LOW as long as the control signal is at HIGH.

In a further preferred embodiment of the invention, an increase in isolation of the diode switch is achieved by disposing at least one semiconductor unit, switched through during the discharge process, in series with the/each stub lead of the at least one diode switch. The semiconductor unit is preferably a diode.

In another preferred further development of the present invention, the circuit comprises an inverting branch connected in parallel with the at least one branch connected to the/each diode switch. The output of the at least one diode switch is terminated by a resistance which corresponds to the system resistance. This prevents reflection of the signal present at the output. When the at least one diode switch is switched, the applied power is terminated by the output. If the diode switch is open, no power is terminated by the output, rather, in this further development, the power is terminated by the inverting branch. The power terminated by the inverting branch is not utilized. However, termination of the power prevents the unused power from being reflected at the output of the at least one diode switch to prevent negative effects on the oscillator producing the carrier signal. The reflected power could cause fluctuations in the oscillator frequency. For use of the circuit in distance radar systems, the spatial resolution and reliability could thereby be impaired. Termination of the unused power curtails the disturbances in the at least one diode switch.

The inverting branch preferably comprises a length which is larger by lambda/4 compared to the branches with the at least one diode switch. When using a diode switch with a lambda/4 stub lead, the inverting branch is approximately designed as a lambda/2 line. To provide useful cooperation between the two branches, i.e. such that the oscillator always sees the system resistance at the input, the two branches must be mutually adjusted. Towards this end, the two branches are operated separately. Both branches are designed such that they have as low a reflection factor as possible when switched.

In another preferred further development of the present invention, a series connection of an inverting unit with a wavelength-selective reflecting unit (so-called stub) is disposed in a branch of the circuit via which the capacitive element is discharged. The inverting unit is disposed between the wavelength-selective reflecting unit and the/each diode switch. The wavelength-selective reflecting unit is reflecting for a frequency range comprising the frequency of the carrier signal, and is conducting for all other frequencies. The inverting unit is formed e.g. as a lambda/4 line. The inverting unit and the wavelength-selective reflecting unit cooperate as a short-circuit for a certain RF frequency range. The frequency range comprises the frequency of the carrier signal and other frequencies in the region between $5 \cdot 10^{-1}$ to 2 times the frequency of the carrier signal.

A further solution of the object of the present invention is based on a method for pulse modulation of a carrier signal of the above-mentioned type, wherein at least one capacitive element is charged and the discharge current of the at least one capacitive element is used for controlling the at least one diode switch.

Further features, possible applications and advantages of the invention can be extracted from the following description of embodiments of the invention which are shown in the drawing. All features described or shown define, individually or collectively in any arbitrary combination, the object of the invention independent of their concise articulation in the claims or their dependencies and independent of their formulation or representation in the description or in the drawing.

DESCRIPTION OF THE PREFERRED EMBODIMENT

Figure 1:
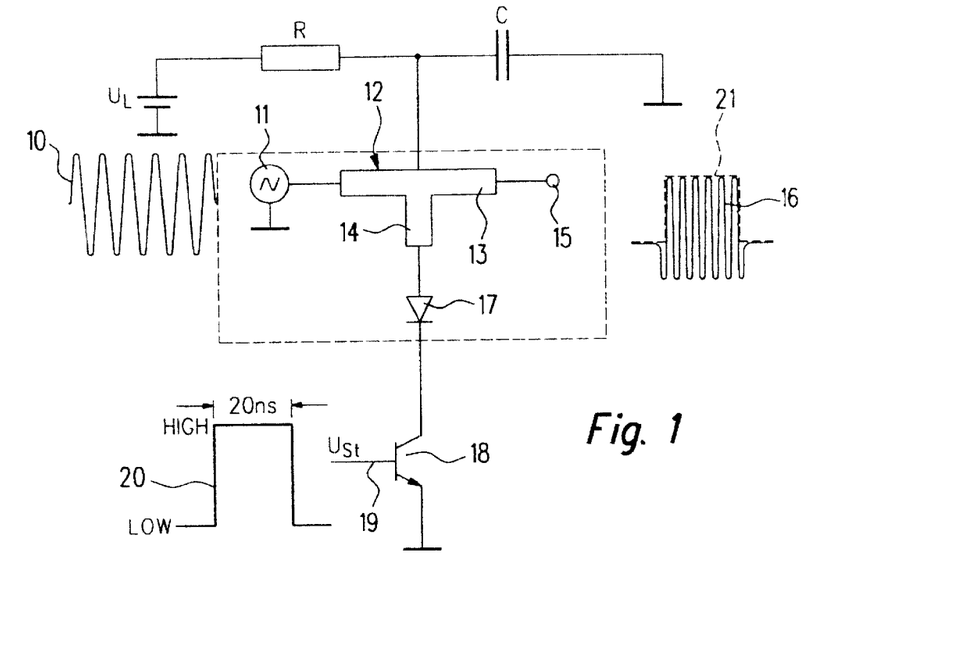
FIG. 1 shows an inventive circuit in accordance with a first preferred embodiment.

FIG. 1 shows an inventive electrical circuit for pulse modulation of a radio-frequency carrier signal 10 in accordance with a first preferred embodiment. The pulse-modulated radio-frequency carrier signal 16 can be used e.g. in a distance radar system for automotive vehicles for localization of an object and determination of the separation between automotive vehicle and object.

The radio-frequency carrier signal 10 is produced by an oscillator 11. The carrier signal 10 is applied to an input of a diode switch 12. The diode switch 12 comprises a signal line 13 and a lambda/4 stub lead 14 which branches off from the signal line 13 at approximately right angles. The pulse-modulated radio-frequency carrier signal 16 is present at an output 15 of the diode switch 12.

The inventive circuit also comprises a voltage source which provides a charging voltage $U_L$ for a capacitive element formed as capacitor C. The charging voltage $U_L$ is e.g. 5V. During charging, the capacitor C is charged through a charging resistance R. The values for the charging resistance R and the capacitor C can vary widely and depend on the desired pulse length, operating or charging voltage, the transistor 18 and diodes 17 of the diode switch 12. In the present embodiment, the charging resistance R has a resistive value of 2 kOhm and the capacitor C has a capacitance of 30 pF.

A series connection of a diode 17 and a semiconductor switch formed as a bipolar transistor 18 is connected to the stub lead 14 of the diode switch 12. The transistor 18 initiates the discharging process of the capacitor C. A control voltage $U_{St}$ is applied to a control contact 19 (base) of the transistor 18. The control voltage $U_{St}$ comprises successive control pulses 20 of a certain pulse length of e.g. 20 ns.

If a LOW signal is applied to the control contact 19 of the transistor 18, the transistor 18 blocks, and the capacitor C cannot be discharged. If a HIGH signal is applied to the control contact 19, the transistor 18 connects through and the capacitor C is discharged via the stub lead 14 of the diode switch 12, the diode 17 and the transistor 18. Rapid discharge of the capacitor C produces a very short current pulse. The length of the current pulse is independent of the length of the control pulse 20 at the control contact 19 of the transistor 18, but depends on the minimum resistance in the conducting state of the transistor 18. The diode 17 represents the consumer in this circuit and could be replaced e.g. by a small resistance.

The discharge current of the capacitor C controls the diode switch 12 and switches the signal line 13 such that the radio-frequency carrier signal 10 of the oscillator 11 is present at the output 15 of the diode switch 12 for the length of the current pulse. A current pulse with fast rise and fall times and therefore a pulse-modulated carrier signal 16 with a particularly clean, square envelope 21 can be produced by the discharge current of the capacitor C. Moreover, the discharge current of the capacitor C can generate particularly short current pulses, wherein the pulse lengths can lie in the region between 0.1 ns to 10 ns. The charging resistance R should be dimensioned such that the capacitor C can almost completely recharge between the discharged state and the next current pulse.

Figure 3:
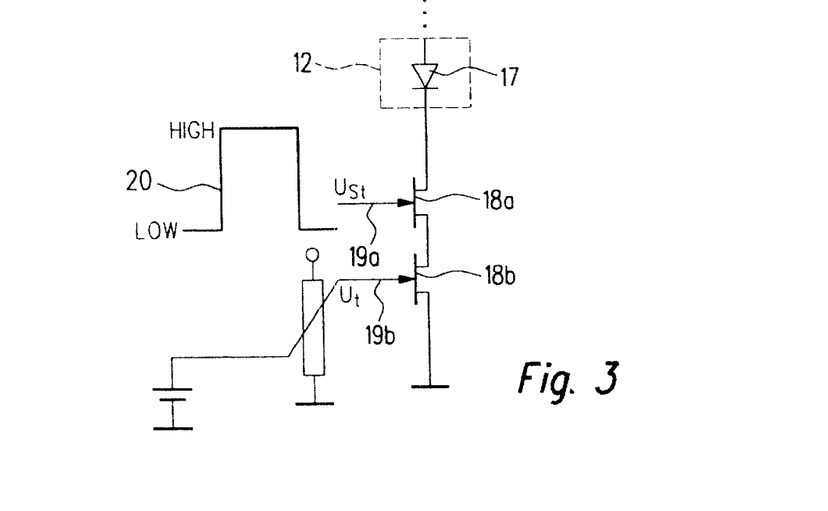
FIG. 3 shows a section of an inventive circuit in accordance with a second preferred embodiment.

FIG. 3 shows a section of an inventive circuit in accordance with a second preferred embodiment. The transistor 18 of FIG. 1 is replaced by a series connection of two field effect transistors (FET) 18a, 18b. The control voltage $U_{St}$ with the control pulses 20 is applied to a control contact 19a (gate) of the first FET 18a. A variable direct voltage $U_t$ is applied to a control contact 19b (gate) of the second FET 18b. It is also possible to use one FET with two control channels (gates), a so-called Dual-Gate-FET instead of two separate FETs 18a, 18b (shown in FIG. 3).

The pulse width of the pulse-modulated signal 16 can be varied by the direct voltage $U_t$. A negative direct voltage $U_t$ at the control channel 19b determines the minimum Drain-Source resistance which can be achieved with a positive control pulse 20 at the control channel 19a. A higher Drain-Source resistance also prolongs the discharge time of the capacitor C and hence the pulse length of the pulse-modulated carrier signal 16. The diode 17 has a low ohmic value as long as a minimum current is maintained through the diode 17.

Figure 4:
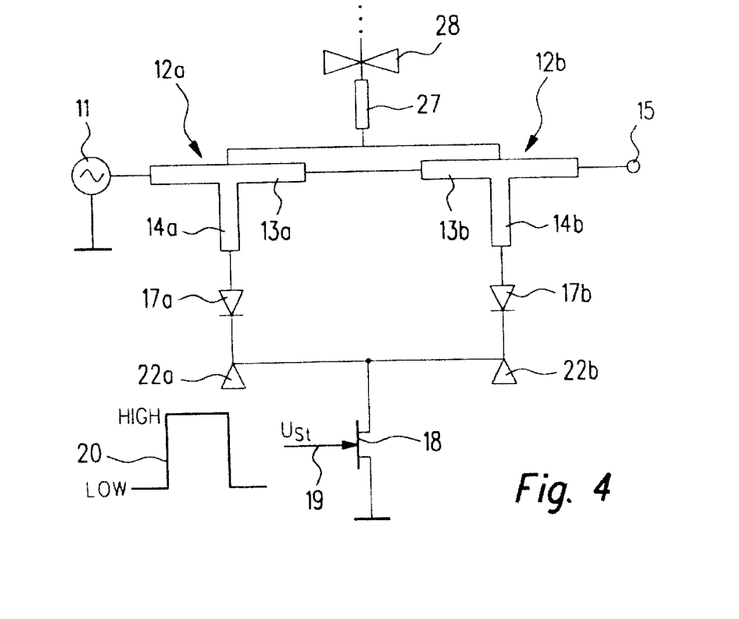
FIG. 4 shows a section of an inventive circuit in accordance with a third preferred embodiment.

FIG. 4 shows a section of an inventive circuit in accordance with a third preferred embodiment. The diode switch 12 including diode 17 of FIG. 1 has been replaced by a parallel connection of two diode switches 12a, 12b and the associated diodes 17a, 17b. Together, these diode switches 12a, 12b have a higher isolation than the diode switch 12 alone, since the isolation of the individual diode switches 12a and 12b sums up. The discharge current of the capacitor C controls the two diodes 17a, 17b of the diode switch 12.

So-called stubs 22a, 22b are disposed below the two diodes 17a, 17b which represent a short-circuit for the frequency of the radio-frequency carrier signal 10. Stubs are wavelength-selective reflecting units. The stubs 22a, 22b cause a defined potential on the diodes 17a, 17b for radio frequency (RF) signals. Moreover, a series connection of an inverting unit 27, formed as a lambda/4 line, and a stub 28 is disposed in a branch of the circuit through which the capacitor C is discharged. The lambda/4 line 27 is disposed between the stub 28 and the diode switches 12a, 12b. The stub 28 is reflecting for one frequency range which comprises the frequency of the carrier signal 10, and is conductive for all other frequencies. Together, the lambda/4 line 27 and the stub 28 effect a short-circuit for a certain RF frequency range.

Figure 5:
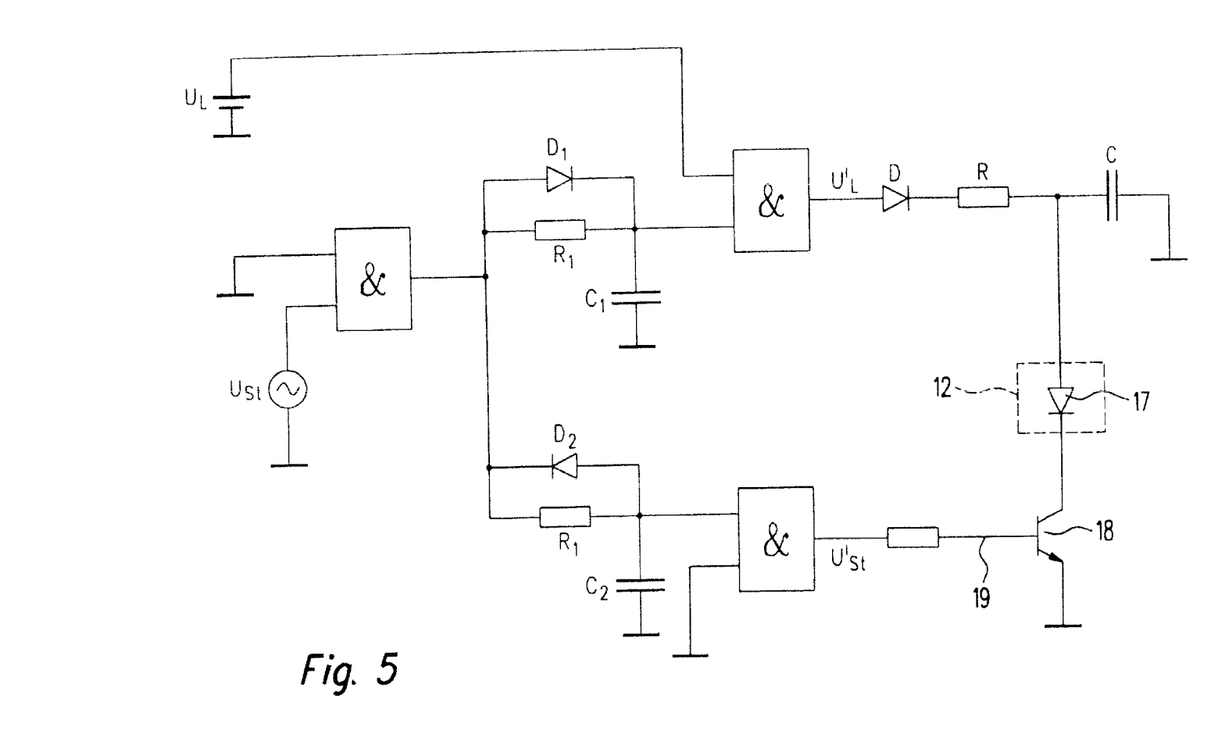
FIG. 5 shows an inventive circuit in accordance with a fourth preferred embodiment.

FIG. 5 shows an inventive circuit in accordance with a fourth preferred embodiment. In contrast to the circuit of FIG. 1, the circuit of FIG. 5 comprises means for interrupting the charging process of the capacitor C for at least as long as a control pulse 20 is applied to the transistor 18 or, alternatively for several transistors 18a, 18b connected in series, a control pulse 20 is applied to at least one transistor 18a. The means comprise one side delaying members $R_1$, $D_1$, $C_1$ and $R_2$, $D_2$, $C_2$ which delay rising sides of the control signal $U_{St}$ and rising sides of the charging voltage $U_L$ (see FIG. 8).

Figure 8:
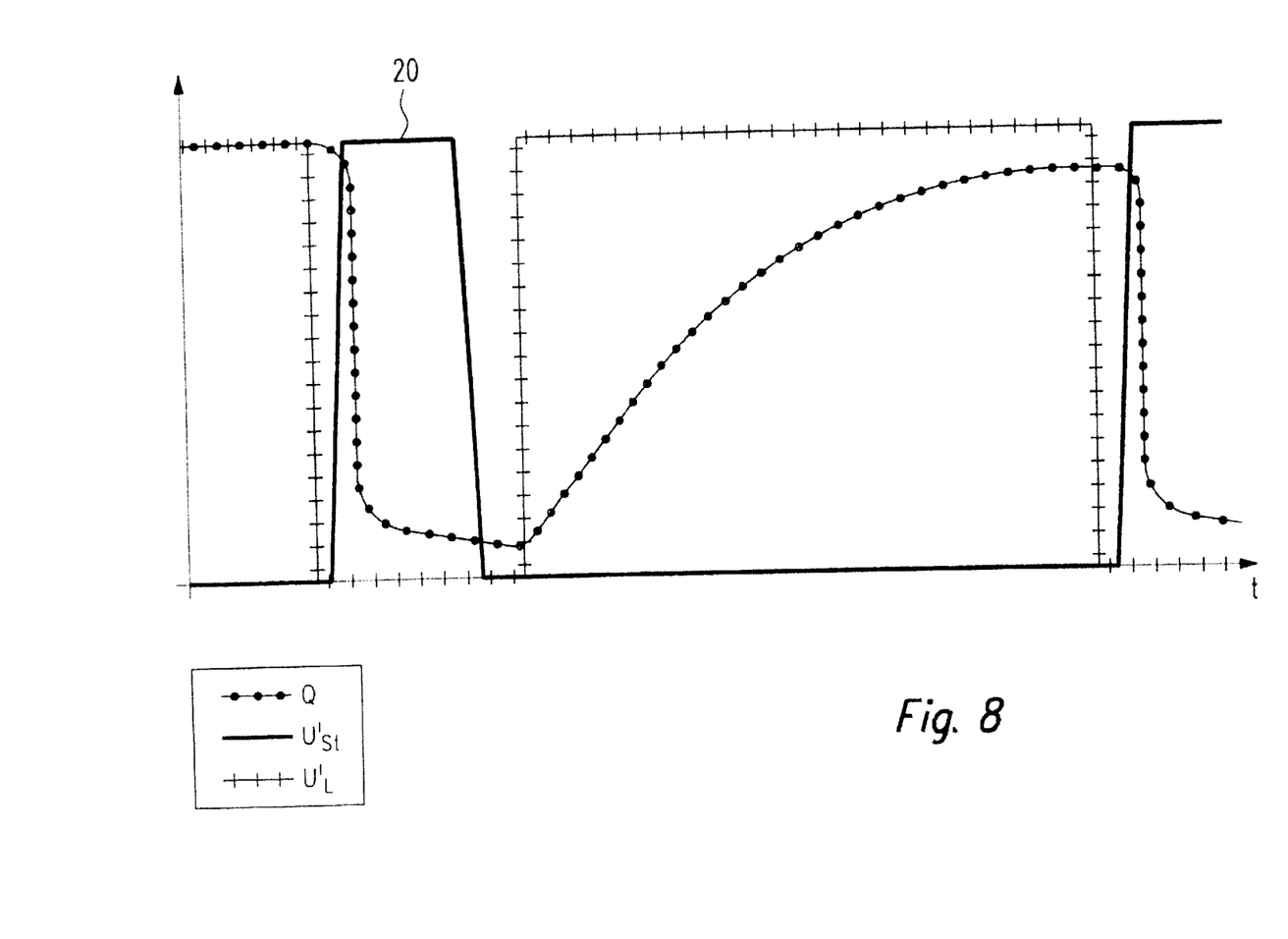
FIG. 8 shows the time-dependent signal development of the circuit of FIG. 5.

Without these one side delaying members, the control signal $U_{St}$ would be exactly inverted with respect to the charging voltage $U_L$. The delaying members $R_1$, $D_1$, $C_1$ and $R_2$, $D_2$, $C_2$ ensure that no residual current flows through the charging resistance R and the diode 17 after the capacitor C is discharged. The diode D, switched through during charging of the capacitor C, prevents discharge of the capacitor C via the resistance R when the charging voltage $U_L$ changes to LOW, i.e. is 0V. "&" in FIG. 5 designates EXOR gates. FIG. 8 shows the time-dependent signal development of the charge Q(t) of the capacitor C, of the delayed control signal $U'_{St}$ and of the delayed charging voltage $U'_L$ of the circuit of FIG. 5.

Figure 6:
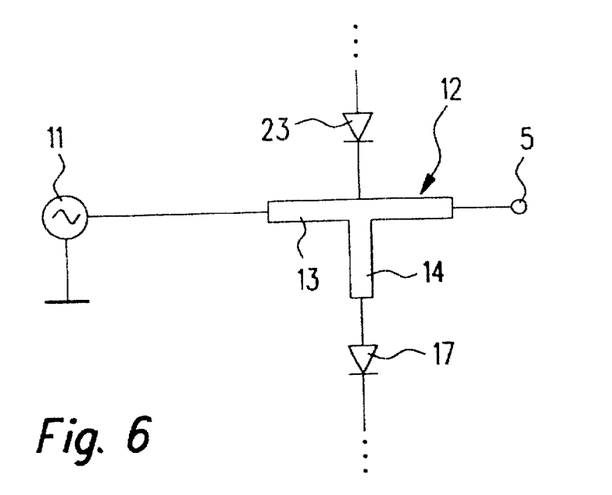
FIG. 6 shows a section of an inventive circuit in accordance with a fifth preferred embodiment.

FIG. 6 shows a section of an inventive circuit in accordance with a fifth preferred embodiment. In contrast to the circuit of FIG. 1, a semiconductor unit 23, formed as diode, is disposed in series with the stub lead 14 or, for several parallel diode switches 12a, 12b, in series with the stub leads 14a, 14b. The diode 23 is switched through during discharge of the at least one capacitor C. The diode 23 connected in series can further increase the isolation of the diode switch 12.

Figure 7:
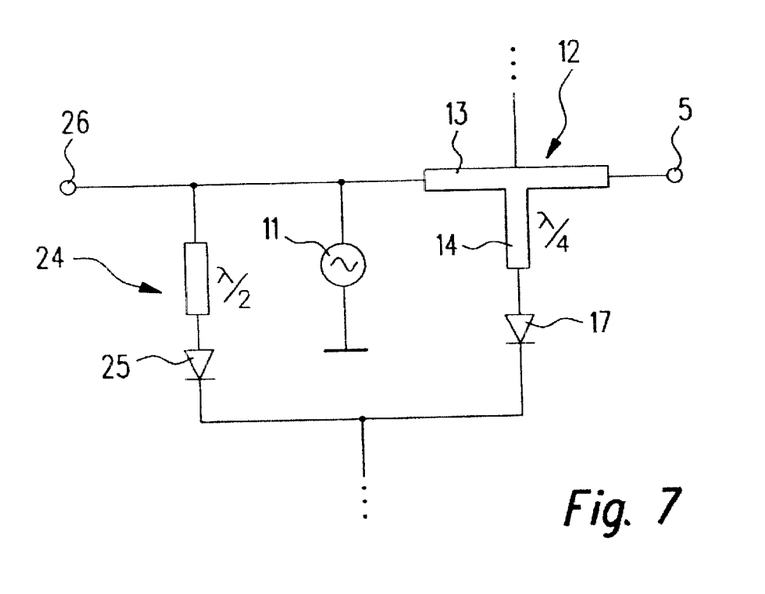
FIG. 7 shows a section of an inventive circuit in accordance with a sixth preferred embodiment.

FIG. 7 shows a section of an inventive circuit in accordance with a sixth preferred embodiment. In contrast to the circuit of FIG. 1, an inverting branch 24 is disposed parallel to the branch of the circuit with the diode switch 12 or, for several parallel diode switches 12a, 12b, parallel to the branches with the diode switches 12a, 12b. The inverting branch 24 is longer by lambda/4 than the branch or branches with the diode switch 12 or the diode switches 12a, 12b. In the present embodiment with a stub lead 14 formed as lambda/4 line, the inverting branch 24 comprises a lambda/2 line. A diode 25 is also disposed in the inverting branch 24.

A signal is available at an output 26 of the inverting branch 24 which is inverted relative to the pulse-modulated signal 16 present at the output 5 of the diode switch 12. Power can therefore be removed at the output 26 when it is not being removed at the output 5, i.e. when the diode switch 12 blocks. This prevents available power from reflecting into the oscillator 11 to impair the frequency of the radio-frequency carrier signal 10 produced by the oscillator 11. For use of the inventive circuit in a distance radar system, such frequency fluctuations would have a negative effect on the accuracy and reliability of the system. This is prevented by the circuit of FIG. 7.

What is claimed is:

1. An electrical circuit for pulse modulation of a carrier signal, the circuit comprising:

at least one diode switch having a first input to which an unmodulated carrier signal is applied, a second input to which a switching control current is applied, and an output at which a pulse modulated carrier signal is produced; and a pulse generator for generating a current pulse, said pulse generator having at least one chargeable capacitive element whose discharge current communicates with said second input of said diode switch to control said diode switch for producing the pulse modulated carrier signal at said output.

2. The circuit of claim 1, wherein the circuit comprises several diode switches with stub leads which are connected in parallel.

3. The circuit of claim 1, wherein the circuit comprises at least one semiconductor switch connected in series with each of said at least one diode switches, wherein said capacitive element is discharged by a control pulse via each of said at least one semiconductor switches and each of said diode switches after control of said at least one semiconductor switch.

4. The circuit of claim 3, wherein said at least one semiconductor switch is a transistor.

5. The circuit of claim 4, wherein said at least one semiconductor switch is a field effect transistor (FET).

6. The circuit of claim 3, wherein the circuit comprises a first and a second semiconductor switch, wherein said control pulse is applied to a first control contact of said first semiconductor switch and a variable direct voltage is applied to a second control contact of said second semiconductor switch.

7. The circuit of claim 6, wherein said first and said second semiconductor switch are constructed by a field effect transistor having two gates.

8. The circuit of claim 1, wherein said pulse generator comprise a semiconductor unit which is switched through during charging of said capacitive element and which is disposed in a branch of the circuit through which said at least one capacitive element is charged.

9. The circuit of claim 8, wherein said the semiconductor unit is a diode.

10. The circuit of claim 3, further comprising means for interrupting a charging process of said at least one capacitive element for at least as long as said control pulse is applied to said at least one semiconductor switch.

11. The circuit of claim 10, wherein said interrupting means comprise unilateral delaying members for delaying rising sides of said control pulse and rising sides of a charging signal.

12. The circuit of claim 1, wherein said pulse generator comprises at least one semiconductor means disposed in series with said second input of said at least one diode switch, wherein said semiconductor means is switched through during a discharging process of said at least one capacitive element.

13. The circuit of claim 1, wherein the circuit comprises an inverting branch which is connected in parallel with at least one branch having said at least one diode switch.

14. The circuit of claim 13, wherein said inverting branch is longer by lambda/4 than said at least one branch having said at least one diode switch.

15. The circuit of claim 1, wherein said pulse generator comprises an inverting unit and a wavelength-selective reflecting unit disposed in series between a branch of the circuit through which said at least one capacitive element is discharged and said second input, wherein said inverting unit is disposed between said wavelength-selective reflecting unit and said second input of said at least one diode switch, said wavelength-selective reflecting unit being reflective for a frequency range including a frequency of the carrier signal, and being conducting for all other frequencies.

16. The circuit of claim 15, wherein said inverting unit is a lambda/4 line.

17. A method for pulse modulation of a carrier signal, the method comprising the steps of:

applying an unmodulated carrier signal to a first input of at least one diode switch, said at least one diode switch having a second input to which a switching control current is applied and an output at which a pulse modulated carrier signal is produced; and generating a current pulse with a pulse generator, said pulse generator having at least one chargeable capacitive element whose discharge current communicates with said second diode switch input to control said diode switch for producing the pulse modulated carrier signal at said output.

* * * * *